(12) United States Patent
Shin

(10) Patent No.: US 10,896,701 B2
(45) Date of Patent: Jan. 19, 2021

(54) HIGH-SPEED DATA READOUT APPARATUS AND CMOS IMAGE SENSOR USING THE SAME

(71) Applicant: SK hynix Inc., Gyeonggi-do (KR)

(72) Inventor: Min-Seok Shin, Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 68 days.

(21) Appl. No.: 16/236,963

(22) Filed: Dec. 31, 2018

(65) Prior Publication Data

US 2020/0082853 A1 Mar. 12, 2020

(51) Int. Cl.
*G11C 7/00* (2006.01)
*G11C 7/10* (2006.01)
*H01L 27/146* (2006.01)
*G11C 11/4096* (2006.01)
*G11C 7/12* (2006.01)

(52) U.S. Cl.
CPC .............. *G11C 7/1048* (2013.01); *G11C 7/12* (2013.01); *G11C 11/4096* (2013.01); *H01L 27/14603* (2013.01)

(58) Field of Classification Search
CPC .... G11C 11/40607; G11C 16/26; G11C 16/32
See application file for complete search history.

(56) References Cited

U.S. PATENT DOCUMENTS 6,466,497 B1 10/2002 Desai et al.
7,130,232 B2 * 10/2006 Kim ..................... G11C 7/1048
365/203
2002/0040992 A1 * 4/2002 Manabe .............. G11C 16/0458
257/314
2002/0057615 A1 * 5/2002 Yahata .................. G11C 11/406
365/222
2002/0080677 A1 * 6/2002 Watanabe ................ G11C 8/12
365/189.011
2002/0185337 A1 * 12/2002 Miura ....................... G11O 5/04
185/11
2005/0132131 A1 * 6/2005 David ................. G11C 11/4076
711/105
2007/0183200 A1 * 8/2007 Tsuruda ................. G11C 16/24
365/185.08

(Continued)

FOREIGN PATENT DOCUMENTS

KR 10-0528468 B1 11/2005

*Primary Examiner* — Tuan T Nguyen
(74) *Attorney, Agent, or Firm* — Perkins Coie LLP

(57) ABSTRACT

A data readout apparatus may include a counter array including an address decoder and a counter circuit, the address decoder being configured to receive an address, the counter circuit being coupled to the address decoder and perform a counting operation based on a column address, a sense amplifier array coupled to the counter array to read out the data from the counter array, a clock driver arranged adjacent to the center of the counter array to distribute clock pulses, a first precharge circuit arranged at one side of the counter array and structured to receive the clock pulses from the clock driver and perform a precharge operation, and a second precharge circuit arranged at the other side of the counter array and structured to receive the clock pulses from the clock driver and perform the precharge operation.

20 Claims, 8 Drawing Sheets

(56) References Cited

U.S. PATENT DOCUMENTS

| | | | | |
|---|---|---|---|---|
| 2008/0158934 A1* | 7/2008 | Kang | ............... | G11C 11/22 |
| | | | | 365/145 |
| 2011/0140741 A1* | 6/2011 | Zerbe | ............... | G11C 7/106 |
| | | | | 327/57 |
| 2015/0189209 A1* | 7/2015 | Yang | ............... | H04N 5/378 |
| | | | | 348/300 |

* cited by examiner

HIGH-SPEED DATA READOUT APPARATUS AND CMOS IMAGE SENSOR USING THE SAME

CROSS-REFERENCE TO RELATED APPLICATION

This patent document claims the priority to and benefits of Korean Patent Application No. 10-2018-0106966 filed on Sep. 7, 2018, which is incorporated herein by reference in its entirety.

TECHNICAL FIELD

The technology and implementations disclosed in this patent document relate to a data readout apparatus and image sensors.

BACKGROUND

Image sensors use photosensing pixels to capture images and can be implemented as complementary metal oxide semiconductor (CMOS) image sensor (CIS) devices. It is desirable to design image sensor in ways to achieve certain device features, including, for example, The high-speed readout, and low power consumption, low noise level, and others.

SUMMARY

This patent document provides, among others, designs of a high-speed data readout apparatus using a dual precharge scheme to read out data of a counter in a circuit using a column-parallel single-slope analog-digital converter (ADC), thus increasing a voltage swing margin of a sense amplifier and an image sensor using the same.

In an embodiment, a data readout apparatus can include a counter array including an address decoder and a counter circuit, the address decoder being configured to receive an address, the counter circuit being coupled to the address decoder and perform, based on the address, a counting operation to convert an analog signal into data; a sense amplifier array coupled to the counter array and structured to read out the data from the counter array; a clock driver arranged adjacent to the center of the counter array to distribute clock pulses; a first precharge circuit arranged at one side of the counter array and structured to receive the clock pulses from the clock driver and perform a precharge operation; and a second precharge circuit arranged at the other side of the counter array and structured to receive the clock pulses from the clock driver and perform the precharge operation.

By the way of example but not limitation, the first precharge circuit can include a first precharge pulse generator arranged in a peripheral region of the counter array to receive the clock pulses from the clock driver and generate a precharge pulse signal; and a first precharge driver coupled to the first precharge pulse generator to receive the precharge pulse signal generated by the first precharge pulse generator to reset differential data lines coupled to the counter array to output the data from the counter array.

The second precharge circuit can include a second precharge pulse generator arranged in another peripheral region of the counter array to receive the clock pulses from the clock driver and generate a precharge pulse signal; and a second precharge driver coupled to the second precharge pulse generator to receive the precharge pulse signal generated by the second precharge pulse generator to reset differential data lines coupled to the counter array to output the data from the counter array.

The first precharge circuit can be arranged in a peripheral region at one side of the counter array, while the second precharge circuit can be arranged in another peripheral region at the other side of the counter array. The clock driver can be arranged adjacent to the center of the bottom or top of the counter array.

In another embodiment, a data readout apparatus can include a counter array including an address decoder and a counter circuit, the address decoder being configured to receive an address, the counter circuit being coupled to the address decoder and perform, based on the address, a counting operation to convert an analog signal into data; a sense amplifier array coupled to the counter array to read out the data from the counter array; a precharge pulse generator to receive clock pulses and generate a precharge pulse signal; and a plurality of precharge drivers distributed over an area of the counter array and coupled in common to the precharge pulse generator, each precharge driver receiving the precharge pulse signal generated by the precharge pulse generator to reset differential data lines.

By the way of example but not limitation, the precharge pulse generator can be arranged in a peripheral region of the counter array. The counter array can include a plurality of counter groups each including a preset number of counters, and the precharge drivers are arranged at each counter group.

In another embodiment, a data readout apparatus can include a counter array including an address decoder and a counter circuit, the address decoder being configured to receive an address, the counter circuit being coupled to the address decoder and perform, based on the address, a counting operation to convert an analog signal into data; a sense amplifier array coupled to the counter array to read out the data from the counter array; a clock driver arranged adjacent to the center of the counter array to distribute clock pulses; a first precharge pulse generator arranged adjacent to one side of the counter array and structured to receive the clock pulses from the clock driver and generate a precharge pulse signal; a second precharge pulse generator arranged adjacent to the other side of the counter array and structured to receive the clock pulses from the clock driver and generate the precharge pulse signal; and a plurality of precharge drivers distributed over an area of the counter array and coupled in common to the first and second precharge pulse generators receiving the precharge pulse signals generated by the first and second precharge pulse generators to reset differential data lines.

In another embodiment, an image sensor can include a pixel array including imaging pixels for sensing incident light to output pixel signals corresponding to the incident light; a row decoder to select and control the imaging pixels within the pixel array at each row line; a data readout apparatus to read out the pixel signals outputted from the pixel array and output the read data; and a control circuit to control the operations of the row decoder and the data readout apparatus. The data readout apparatus can include a counter array including an address decoder and a counter circuit, the address decoder being configured to receive a column address, the counter circuit being coupled to the address decoder and perform, based on the column address, a counting operation to convert the pixel signals into data; a sense amplifier array coupled to the counter array and structured to read out the data from the counter array; a clock driver arranged adjacent to the center of the counter array and structured to distribute a column clock; a first precharge circuit arranged at one side of the counter array and structured to receive the column clock from the clock driver and perform a precharge operation; and a second precharge circuit arranged at the other side of the counter array and structured to receive the column clock from the clock driver and perform the precharge operation.

In another embodiment, an image sensor can include a pixel array including imaging pixels for sensing incident light to output pixel signals corresponding to the incident light; a row decoder to select and control the imaging pixels within the pixel array at each row line; a data readout apparatus to read out the pixel signals outputted from the pixel array and output the read data; and a control circuit to control the operations of the row decoder and the data readout apparatus. The data readout apparatus can include a counter array including an address decoder and a counter circuit, the address decoder being configured to receive a column address, the counter circuit being coupled to the address decoder and perform, based on the column address, a counting operation to convert the pixel signals into data; a sense amplifier array coupled to the counter array and structured to read out the data from the counter array; a precharge pulse generator structured to receive a column clock and generate a precharge pulse signal; and a plurality of precharge drivers distributed over an area of the counter array and coupled in common to the precharge pulse generator, each precharge driver receiving the precharge pulse signal generated by the precharge pulse generator to reset differential data lines.

In another embodiment, an image sensor can include a pixel array including imaging pixels for sensing incident light to output pixel signals corresponding to the incident light; a row decoder to select and control the imaging pixels within the pixel array at each row line; a data readout apparatus to read out the pixel signals outputted from the pixel array and output the read data; and a control circuit to control the operations of the row decoder and the data readout apparatus. The data readout apparatus can include a counter array including an address decoder and a counter circuit, the address decoder being configured to receive a column address, the counter circuit being coupled to the address decoder and perform, based on the column address, a counting operation to convert the pixel signals into data; a sense amplifier array coupled to the counter array to read out the data from the counter array; a clock driver arranged adjacent to the center of the counter array to distribute a column clock; a first precharge pulse generator arranged at one side of the counter array and structured to receive the column clock from the clock driver and generate a precharge pulse signal; a second precharge pulse generator arranged at the other side of the counter array and structured to receive the column clock from the clock driver and generate the precharge pulse signal; and a plurality of precharge drivers distributed over an area of the counter array and coupled in common to the first and second precharge pulse generators receiving the precharge pulse signals generated by the first and second precharge pulse generators to reset differential data lines.

In another embodiment, a data readout apparatus may include: a counter array suitable for performing a counting operation according to a column address; a sense amplifier array suitable for reading data from the counter array; a clock driver placed at the central position of the counter array, and suitable for dividing a column clock supplied from an external digital timing generator; a first precharge block placed at one side of the counter array, and suitable for receiving the column clock from the clock driver and performing a precharge operation; and a second precharge block placed at the other side of the counter array, and suitable for receiving the column clock from the clock driver and performing the precharge operation.

In another embodiment, a data readout apparatus may include: a counter array suitable for performing a counting operation according to a column address; a sense amplifier array suitable for reading data from the counter array; a precharge pulse generator suitable for receiving a column clock supplied from an external digital timing generator, and generating a precharge pulse signal; and one or more precharge drivers distributed and arranged in the counter array, and each suitable for receiving the precharge pulse signal generated through the precharge pulse generator and resetting differential data lines.

In another embodiment, a data readout apparatus may include: a counter array suitable for performing a counting operation according to a column address; a sense amplifier array suitable for reading data from the counter array; a clock driver placed at the central position of the counter array, and suitable for dividing a column clock supplied from an external digital timing generator; a first precharge pulse generator placed at one side of the counter array, and suitable for receiving the column clock from the clock driver and generating a precharge pulse signal; a second precharge pulse generator placed at the other side of the counter array, and suitable for receiving the column clock from the clock driver and generating a precharge pulse signal; and one or more precharge drivers distributed and arranged in the counter array, and suitable for receiving the precharge pulse signals generated through the first and second precharge pulse generators and resetting differential data lines.

In another embodiment, a CIS may include: a pixel array suitable for outputting pixel signals corresponding to incident light; a row decoder suitable for selecting and controlling a pixel within the pixel array at each row line; a data readout apparatus suitable for reading out the pixel signals outputted from the pixel array and outputting the read data; and a control unit suitable for controlling the operations of the row decoder and the data readout apparatus, wherein the data readout apparatus includes: a counter array suitable for performing a counting operation according to a column address; a sense amplifier array suitable for reading data from the counter array; a clock driver placed at the central position of the counter array, and suitable for dividing a column clock supplied from an external digital timing generator; a first precharge block placed at one side of the counter array, and suitable for receiving the column clock from the clock driver and performing a precharge operation; and a second precharge block placed at the other side of the counter array, and suitable for receiving the column clock from the clock driver and performing the precharge operation.

In another embodiment, a CIS may include: a pixel array suitable for outputting pixel signals corresponding to incident light; a row decoder suitable for selecting and controlling a pixel within the pixel array at each row line; a data readout apparatus suitable for reading out the pixel signals outputted from the pixel array and outputting the read data; and a control unit suitable for controlling the operations of the row decoder and the data readout apparatus, wherein the data readout apparatus includes: a counter array suitable for performing a counting operation according to a column address; a sense amplifier array suitable for reading data from the counter array; a precharge pulse generator suitable for receiving a column clock supplied from an external digital timing generator, and generating a precharge pulse signal; and one or more precharge drivers distributed and arranged in the counter array, and each suitable for receiving the precharge pulse signal generated through the precharge pulse generator and resetting differential data lines.

In another embodiment, a CIS may include: a pixel array suitable for outputting pixel signals corresponding to incident light; a row decoder suitable for selecting and controlling a pixel within the pixel array at each row line; a data readout apparatus suitable for reading out the pixel signals outputted from the pixel array and outputting the read data; and a control unit suitable for controlling the operations of the row decoder and the data readout apparatus, wherein the data readout apparatus includes: a counter array suitable for performing a counting operation according to a column address; a sense amplifier array suitable for reading data from the counter array; a clock driver placed at the central position of the counter array, and suitable for dividing a column clock supplied from an external digital timing generator; a first precharge pulse generator placed at one side of the counter array, and suitable for receiving the column clock from the clock driver and generating a precharge pulse signal; a second precharge pulse generator placed at the other side of the counter array, and suitable for receiving the column clock from the clock driver and generating a precharge pulse signal; and one or more precharge drivers distributed and arranged in the counter array, and suitable for receiving the precharge pulse signals generated through the first and second precharge pulse generators and resetting differential data lines.

In another embodiment, a data readout apparatus includes a counter array including a plurality of counter circuits structured to perform a counting operation regarding a result of comparing a pixel signal, based on a column address, with a reference signal to convert an analog signal into data, a sense amplifier array coupled to the counter array and structured to read out the data from the counter array, a clock driver arranged adjacent to the center of the counter array to distribute clock pulses, a first precharge circuit arranged adjacent to one side of the counter array and structured to receive the clock pulses from the clock driver and perform a precharge operation, and a second precharge circuit arranged adjacent to the other side of the counter array and structured to receive the clock pulses from the clock driver and perform the precharge operation.

In another embodiment, a data readout apparatus includes a counter array, including a plurality of counter circuits, structured to perform a counting operation regarding a result of comparing a pixel signal, based on the address, with a reference signal to convert an analog signal into data; a sense amplifier array coupled to the counter array to read out the data from the counter array; a precharge pulse generator to receive clock pulses and generate a precharge pulse signal; and a plurality of precharge drivers distributed over an area of the counter array and coupled in common to the precharge pulse generator, each precharge driver receiving the precharge pulse signal generated by the precharge pulse generator to reset differential data lines.

In another embodiment, a data readout apparatus includes a counter array, including a plurality of counter circuits, structured to perform a counting operation regarding a result of comparing a pixel signal, based on a column address, with a reference signal to convert an analog signal into data; a sense amplifier array coupled to the counter array to read out the data from the counter array; a clock driver arranged adjacent to the center of the counter array to distribute clock pulses; a first precharge pulse generator arranged adjacent to one side of the counter array and structured to receive the clock pulses from the clock driver and generate a precharge pulse signal; a second precharge pulse generator arranged adjacent to the other side of the counter array and structured to receive the clock pulses from the clock driver and generate the precharge pulse signal; and a plurality of precharge drivers distributed over an area of the counter array and coupled in common to the first and second precharge pulse generators receiving the precharge pulse signals generated by the first and second precharge pulse generators to reset differential data lines.

In another embodiment, an image sensor includes a pixel array including imaging pixels for sensing incident light to output pixel signals corresponding to the incident light; a row decoder to select and control the imaging pixels within the pixel array at each row line; a data readout apparatus to read out the pixel signals outputted from the pixel array and output the read data; and a control circuit to control the operations of the row decoder and the data readout apparatus. The data readout apparatus includes a counter array, including a plurality of counter circuits, structured to perform a counting operation regarding a result of comparing a pixel signal, based on a column address, with a reference signal to convert an analog signal into data; a sense amplifier array coupled to the counter array and structured to read out the data from the counter array; a clock driver arranged adjacent to the center of the counter array and structured to distribute a column clock; a first precharge circuit arranged at one side of the counter array and structured to receive the column clock from the clock driver and perform a precharge operation; and a second precharge circuit arranged at the other side of the counter array and structured to receive the column clock from the clock driver and perform the precharge operation.

In another embodiment, an image sensor includes a pixel array including imaging pixels for sensing incident light to output pixel signals corresponding to the incident light; a row decoder to select and control the imaging pixels within the pixel array at each row line; a data readout apparatus to read out the pixel signals outputted from the pixel array and output the read data; and a control circuit to control the operations of the row decoder and the data readout apparatus. The data readout apparatus includes a counter array, including a plurality of counter circuits, structured to perform a counting operation regarding a result of comparing a pixel signal, based on a column address, with a reference signal to convert an analog signal into data; a sense amplifier array coupled to the counter array and structured to read out the data from the counter array; a precharge pulse generator structured to receive a column clock and generate a precharge pulse signal; and a plurality of precharge drivers distributed over an area of the counter array and coupled in common to the precharge pulse generator, each precharge driver receiving the precharge pulse signal generated by the precharge pulse generator to reset differential data lines.

In another embodiment, an image sensor includes a pixel array including imaging pixels for sensing incident light to output pixel signals corresponding to the incident light; a row decoder to select and control the imaging pixels within the pixel array at each row line; a data readout apparatus to read out the pixel signals outputted from the pixel array and output the read data; and a control circuit to control the operations of the row decoder and the data readout apparatus. The data readout apparatus includes a counter array, including a plurality of counter circuits, structured to perform a counting operation regarding a result of comparing a pixel signal, based on a column address, with a reference signal to convert an analog signal into data; a sense amplifier array coupled to the counter array to read out the data from the counter array; a clock driver arranged adjacent to the center of the counter array to distribute a column clock; a first precharge pulse generator arranged at one side of the counter array and structured to receive the column clock from the clock driver and generate a precharge pulse signal; a second precharge pulse generator arranged at the other side of the counter array and structured to receive the column clock from the clock driver and generate the precharge pulse signal; and a plurality of precharge drivers distributed over an area of the counter array and coupled in common to the first and second precharge pulse generators receiving the precharge pulse signals generated by the first and second precharge pulse generators to reset differential data lines.

DETAILED DESCRIPTION

Image sensors can be designed in certain ways to achieve desired performance. However, there can be conflicting considerations and trade-offs. For example, there is a trade-off between the high-speed readout and low power consumption. Thus, in order to facilitate the high-speed readout of large pixel array without consuming much power, many of image sensors such as CIS use a column-parallel architecture to satisfy both high speed and low power requirements. The column-parallel architecture, together with the small pixel width of the current CIS pixel layout, can render the integration of analog-to-digital converters (ADCs) more difficult, and thus many of image sensors use single-slope ADCs with a simple structure.

The higher the resolution of the CIS, the higher the number of columns included in the CIS. Therefore, a column-parallel readout scheme using a single-slope ADC may be used to achieve a high-speed readout with low voltage, low noise characteristics, thereby implementing a high-resolution, high-speed CIS. Here, the column-parallel single-slope ADC includes a counter at each column. Image data values of all pixels included in one row line are analog-digital converted and stored in a memory within the counter. Then, the resultant values of the analog-digital conversion are transferred to a digital block at the rear stage of the single-slope ADC and processed by the digital block at high speed.

Since the time required for reading out all data is relatively short given the amount of data to be transmitted through readout paths of a plurality of channels, the number of channels for the data readout is increased to meet constraints relating to a data processing speed and a voltage swing margin of a sensing amplifier for decomposing the data of the counter. Therefore, the data readout speed is important to reduce the number of channels required in the data readout path, reducing the numbers of sense amplifiers and data lines to achieve miniaturized, low-power image sensors.

Figure 1:
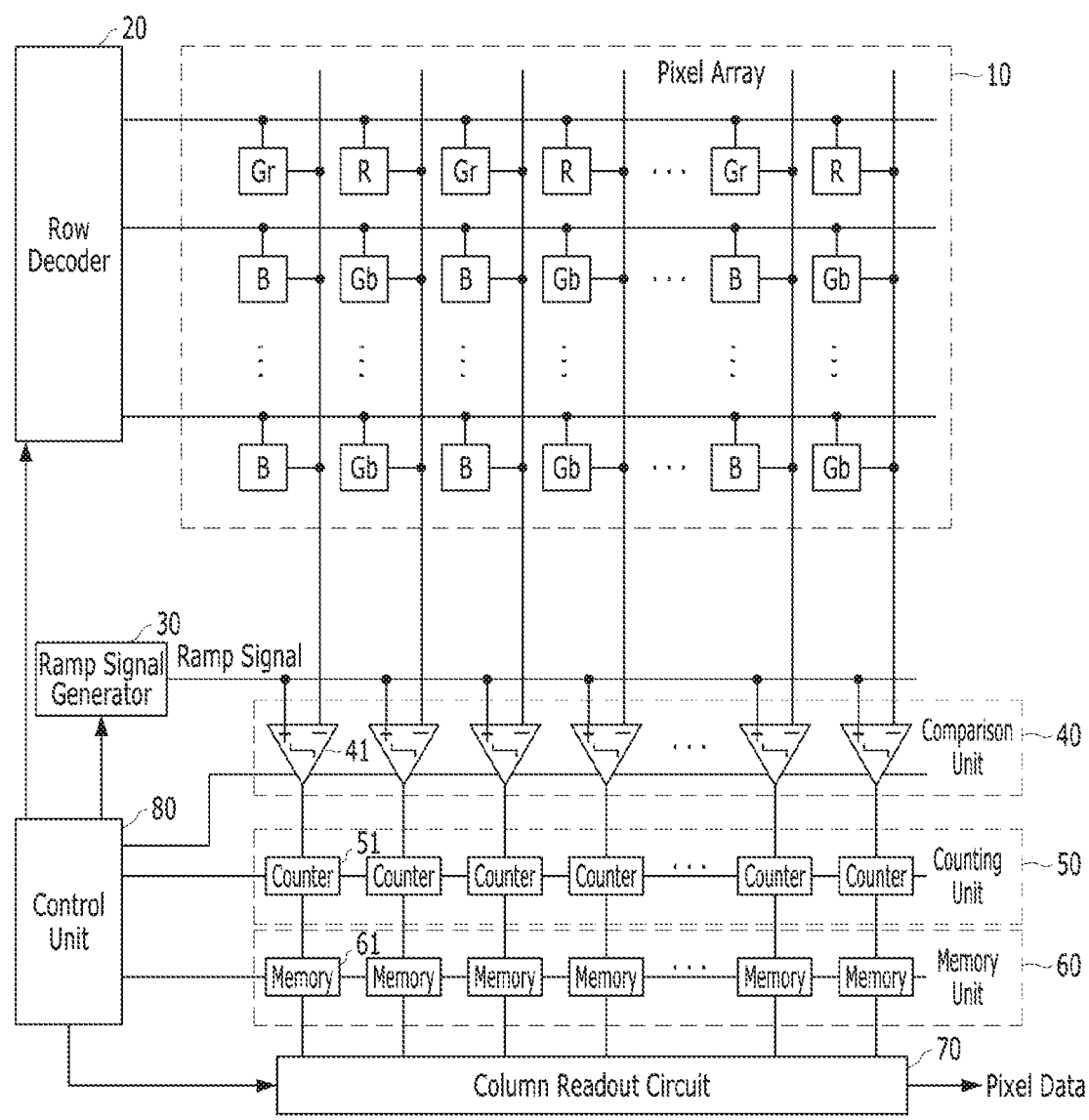
FIG. 1 illustrates an example of an image sensor implemented based on some embodiments of the disclosed technology.

FIG. 1 illustrates an example of an image sensor implemented based on some embodiments of the disclosed technology, showing an image sensor with a column parallel structure implemented using general single-slope analog-to-digital converters (ADCs).

The image sensor implemented based on some embodiments of the disclosed technology may include a pixel array 10, a row decoder 20, a ramp signal generator 30, a comparison circuit 40, a counting circuit 50, a memory circuit 60, a control circuit 80 and a column readout circuit 70. In some embodiments of the disclosed technology, the image sensor can be semiconductor photosensors formed a substrate such as a CIS using a column parallel architecture. The image sensor may include an imaging sensor array of imaging pixels used to convert received incident light onto different imaging pixels into electrical charges or signals to represent images carried in the incident light. The pixel array 10 may output pixel signals corresponding to incident light. The row decoder 20 may select a pixel within the pixel array 10 at each row line and control an operation of the selected pixel based on control signals provided by of the control circuit 80. The ramp signal generator 30 may generate a ramp signal based on control signals provided by the control circuit 80. In some embodiments of the disclosed technology, the ramp signal generated by the ramp signal generator 30 may be a signal that ramps up or down (e.g., saw-tooth signal) to be compared with the pixel signals. The comparison circuit 40 may compare the value of the ramp signal applied from the ramp signal generator 30 to the values of the pixel signals outputted from the pixel array 10 based on control signals of the control circuit 80. The counting circuit 50 may count up with each clock pulse applied from the control circuit 80 based on output signals from the comparison circuit 40. For example, the ramp signal is compared with the pixel signal by the comparison circuit 40, and the counting circuit 50 will continue counting until a certain event occurs (e.g., until a ramping-up signal exceeds the pixel signal, or until the pixel signal exceeds a ramping-down ramp signal). The memory circuit 60 may store the count provided by the counting circuit 50 based on control signals of the control circuit 80. The control circuit 80 may control the operations of the row decoder 20, the ramp signal generator 30, the comparison circuit 40, the counting circuit 50, the memory circuit 60 and the column readout circuit 70. The column readout circuit 70 may sequentially output the data of the memory circuit 60 as pixel data PXDATA based on control signals of the control circuit 80.

The image sensor (e.g., CIS) can remove an undesired offset by comparing a pixel signal (pixel output voltage) measured before light is incident onto the image sensor with a pixel signal measured after light is incident onto the image sensor. Such a technique may be referred to as correlated double sampling (CDS). The CDS may be performed by the comparison circuit 40.

In some embodiments of the disclosed technology, the comparison circuit 40 may include a plurality of comparators, the counting circuit 50 may include a plurality of counters, and the memory circuit 60 may include a plurality of memories. That is, each column has its own comparator, counter, and memory.

Referring to FIG. 1, the comparator, counter and memory may operate as follows.

A first comparator 41 may receive a pixel signal outputted from a first column of the pixel array 10 through a terminal coupled thereto and receive the ramp signal applied from the ramp signal generator 30 through the other terminal coupled thereto. The first comparator 41 may compare the values of the two signals based on a control signal from the control circuit 80, and output a comparison signal indicating which signal, between the pixel signal and the ramp signal, is larger.

Since the ramp signal $V_{RAMP}$ has a voltage level that increases or decreases to a predetermined magnitude over time after initialization, the values of the two signals inputted to the respective terminals of the comparator may coincide with each other at a certain point in time. After this point in time, the value of the comparison signal outputted from the comparator is inverted.

Therefore, based on the clock pulses provided by the control circuit 80, a first counter 51 may count up with each clock pulse from a point in time when the ramp signal starts to fall until after a point in time when the comparison signal outputted from the comparator 41 is inverted, and may output the counter value. The counter may be reset based on a reset control signal from the control circuit 80.

A first memory 61 may store the counter value received from the counter 51 and output the stored counter value to the column readout circuit 70, based on a load control signal from the control circuit 80.

In some embodiments of the disclosed technology, the image sensor may reset the counter 51 using a reset signal (reset voltage) and then convert an image signal (signal voltage) into digital signals using the counter 51.

Figure 2:
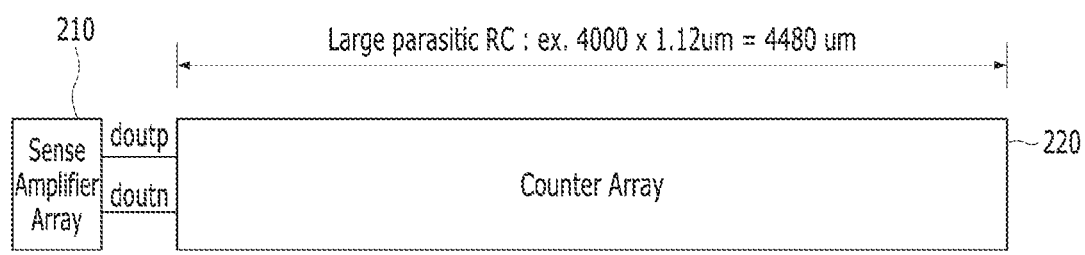
FIG. 2 is a block diagram of an example of a data readout apparatus implemented based on some embodiments of the disclosed technology.

FIG. 2 is a block diagram illustrating an example of a data readout apparatus implemented based on some embodiments of the disclosed technology, showing parasitic elements such as parasitic resistance or parasitic capacitance (e.g., parasitic RC load) of a data readout line using a column-parallel single-slope analog to digital converter (ADC) for a high-resolution image sensor.

In some embodiments of the disclosed technology, a sense amplifier array 210 may be coupled to a side of a counter array 220 extending in a direction. Here, since the counter array 220 may include several hundreds to thousands of counters coupled to several hundreds to thousands of column lines in the pixel array 10 shown in FIG. 1, an input voltage swing margin of a sense amplifier may be limited by a transistor load and a parasitic RC load of a data readout line.

Figure 3:
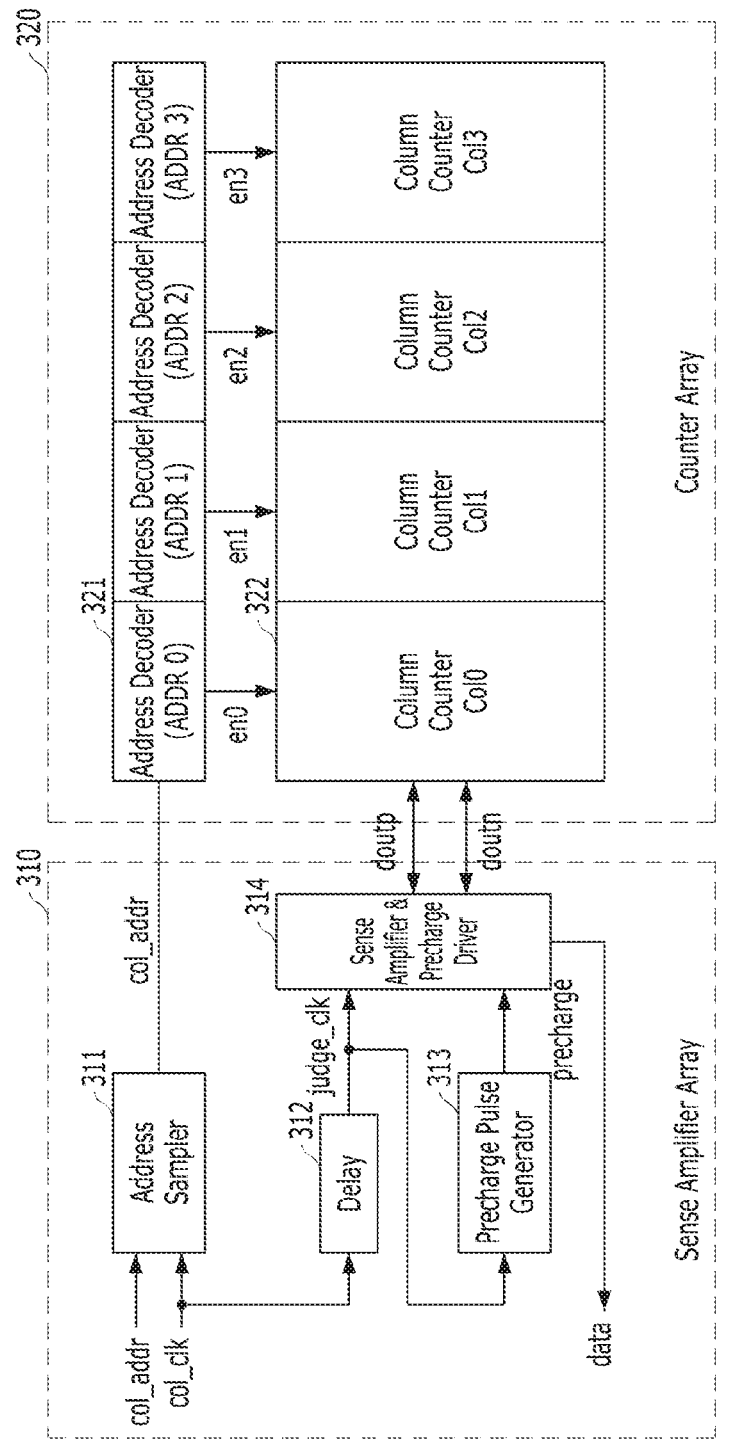
FIG. 3 is a configuration diagram of an example of the data readout apparatus implemented based on some embodiments of the disclosed technology.

FIG. 3 is a configuration diagram illustrating an example of a data readout apparatus implemented based on some embodiments of the disclosed technology, showing a sense amplifier array 310 of a column-parallel single-slope ADC reading data from a counter array 320.

The sense amplifier array 310 may include an address sampler 311, a delay 312, a precharge pulse generator 313 and a sense amplifier and precharge driver 314. The address sampler 311 may receive a column address col_addr and a column clock col_clk from a digital timing generator (not illustrated). The address sampler 311 may be used to capture and store the column address to be transmitted to the counter array 320. For example, the address sampler 311 may sample the column address and transfer the sampled column address to an address decoder 321 of the counter array 320. The delay 312 may receive the column clock col_clk from the digital timing generator (not illustrated), and may generate a judge clock judge_clk. For example, the delay 312 may generate the judge clock judge_clk by delaying a certain amount to output the judge clock judge_clk at desired timings. The precharge pulse generator 313 may receive the judge clock judge_clk generated by the delay 312 to generate a precharge pulse signal based on the judge clock judge_clk. The sense amplifier and precharge driver 314 may receive the judge clock judge_clk generated by the delay 312 and the precharge pulse signal generated by the precharge pulse generator 313, sense and amplify differential data signals doutp and doutn inputted from a column counter 322 of the counter array 320, and reset differential data lines that are used to carry differential data signals (e.g., doutp and doutn).

Before reading out data from the counter array 320, the sense amplifier array 310 may precharge the differential data lines. The sense amplifier array 310 is configured to sense low power signals from the differential data lines and amplify the small voltage swing to recognizable logic levels so the data (e.g., the counter data values) can be interpreted properly.

The counter array 320 may include a plurality of address decoders 321 and a plurality of column counters 322. Each of the address decoders 321 may recognize which column is to be selected based on the column address col_addr received from the address sampler 311 of the sense amplifier array 310. Each of the column counters 322 may operate based on an enable signal provided by the corresponding address decoder 321. The address decoder 321 and the column counter 322 may be provided for each of the columns. For example, each column includes the address decoders 321 and the column counters 322.

By the way of example and not by limitation, the above-described data readout apparatus of FIG. 3 uses the address decoding method. As another example, the data readout apparatus may be implemented using shift registers.

Figure 4A:
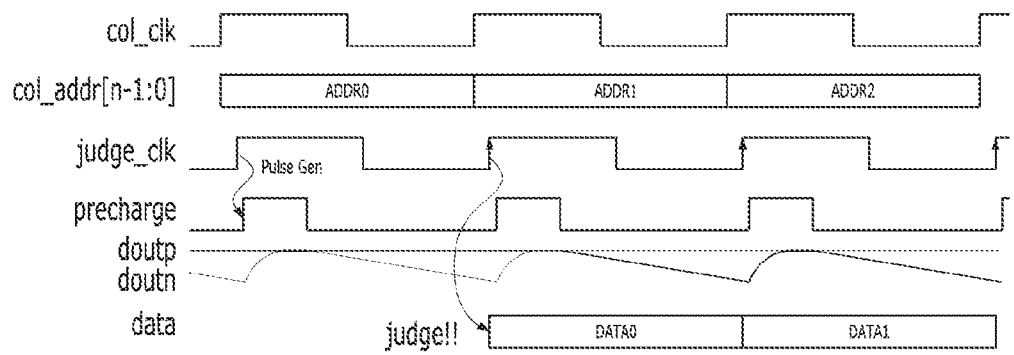
FIGS. 4A and 4B are examples of timing diagrams of the data readout apparatus of FIG. 3.
Figure 4B:
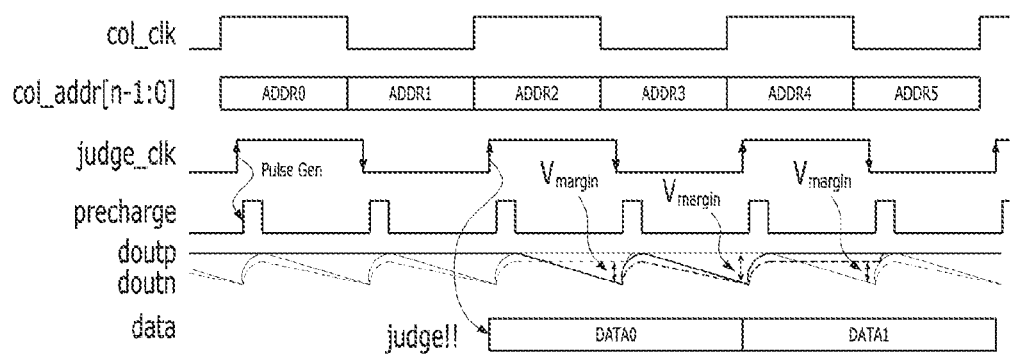

FIGS. 4A and 4B are examples of timing diagrams of the data readout apparatus of FIG. 3. FIG. 4A illustrates timing diagrams of a general data readout method, and FIG. 4B illustrates timing diagrams to show a voltage swing margin can vary depending on precharge performance (e.g., a DDR readout method).

As illustrated in FIG. 4A, the column address col_addr may be sampled at a rising edge of the column clock col_clk, and thus may change at each column clock col_clk. The judge clock judge_clk and the precharge pulse signal may be generated by the delay 312 and the precharge pulse generator 313. When the readout speed is low, the time window between two adjacent precharge operations is long enough to complete the precharge operations, and the voltage swing margin may be set to a value that is sufficient to recognize logic levels of the voltage swing.

Provided the readout speed is doubled as illustrated in FIG. 4B, however, restrictions on the voltage swing margin and the time window between precharge operations become more difficult to satisfy. In an idea situation, the differential data lines may be precharged as desired and the voltage swing margin may be sufficiently secured as indicated by a solid line in FIG. 4B. However, when the differential data lines are not precharged as desired, the voltage swing margin may be decreased as indicated by a dotted line where a data value opposite to the previous data value is carried through the differential data lines.

In implementing high-resolution image sensors that include a large amount of parasitic resistive and capacitive elements (e.g., parasitic RC load), a desired voltage swing margin may be achieved by increasing a sink current or by reducing the bandwidth of a precharge pulse signal. However, the increase in the sink current may result in an increase not only in the power consumption, but also in the transistor size, thereby increasing the size of the image sensor chip. Furthermore, in a counter structure using an SRAM as a latch, it is difficult to increase the sink current because the sink current is determined by cell design. Therefore, a desired voltage swing margin may be achieved by decreasing the bandwidth of the precharge pulse signal, but this may be limited by parasitic resistive and capacitive elements (e.g. parasitic RC load).

Therefore, a data readout apparatus implemented based on some embodiments of the disclosed technology use a dual precharge scheme, instead of a single precharge scheme, to read out data from a counter, thereby increasing a voltage swing margin of a sense amplifier. The data readout apparatus will be described in detail with reference to FIGS. 5 to 8.

Figure 5:
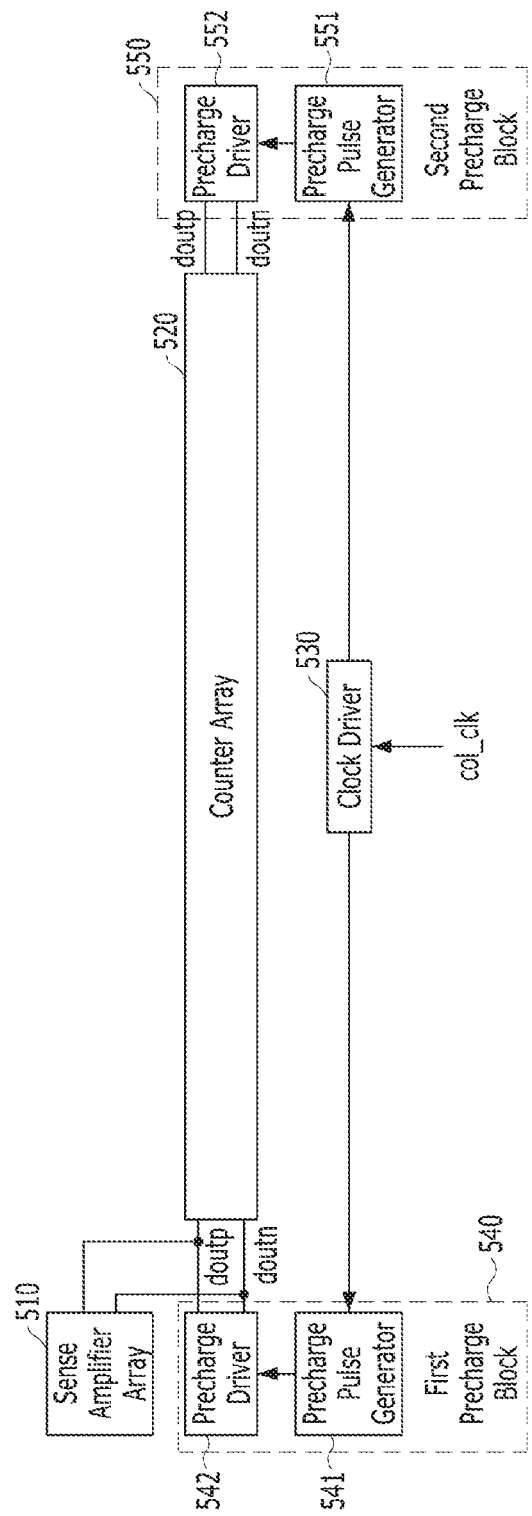
FIG. 5 is a configuration diagram of an example of a data readout apparatus implemented based on some embodiments of the disclosed technology.

FIG. 5 is a configuration diagram of an example of the data readout apparatus implemented based on some embodiments of the disclosed technology, illustrating a structure in which precharge drivers are placed at two sides of a counter array 520 to reduce a parasitic RC load of the precharge drivers, and a clock driver 530 is placed at the central position of the counter array 520 in order to avoid timing skew between precharge pulse signals.

The data readout apparatus implemented based on some embodiments of the disclosed technology may include a counter array 520, a sense amplifier array 510, a clock driver 530, a first precharge circuit 540, and a second precharge circuit 550. The counter array 520 may perform a counting operation to convert a pixel signal delivered according to a column address col_addr into data. The sense amplifier array 510 may read the data from the counter array 520. The clock driver 530 may be arranged adjacent to the center of the counter array 520 to distribute column clock pulses col_clk applied from a digital timing generator (not illustrated). The first precharge circuit 540 may be coupled to one side of the counter array 520 to receive the column clock col_clk from the clock driver 530 and perform a precharge operation. The second precharge circuit 550 may be coupled to the other side of the counter array 520 to receive the column clock col_clk from the clock driver 530 and perform a precharge operation.

The first precharge circuit 540 may include a precharge pulse generator 541 and a precharge driver 542. The precharge pulse generator 541 may be arranged in a peripheral region adjacent to a side of the counter array 520. The precharge pulse generator 541 may receive the column clock col_clk from the clock driver 530 and generate a precharge pulse signal. The precharge driver 542 may receive the precharge pulse signal generated by the precharge pulse generator 541 and reset differential data lines.

The second precharge circuit 550 may include a precharge pulse generator 551 and a precharge driver 552. The precharge pulse generator 551 may be arranged in another peripheral region adjacent to the other side of the counter array 520. The precharge pulse generator 551 may receive the column clock col_clk from the clock driver 530 and generate a precharge pulse signal. The precharge driver 552 may receive the precharge pulse signal generated by the precharge pulse generator 551 and reset differential data lines.

The data readout apparatus implemented based on some embodiments of the disclosed technology may use the dual precharge scheme to increase the bandwidth of the precharge pulse signal that otherwise would have been limited by the parasitic RC load. In some embodiments of the disclosed technology, the precharge pulse generators 541 and 551 and the precharge drivers 542 and 552 may be placed in the peripheral region or in the peripheral devices at both sides of the counter array 520 to reduce the influence by the parasitic RC load. Therefore, each of the precharge pulse generators 541 and 551 and each of the precharge drivers 542 and 552 can cover half of the precharge pulse signals, thereby increasing the voltage switching margin.

In a scenario where the precharge pulse signals sent from the precharge pulse generators 541 and 551 placed in the peripheral regions at both sides of the counter array 520 are not generated at the same point in time, the precharge pulse signal may be lengthened. Thus, in order to prevent such a problem, the clock driver 530 may be placed at the center of the bottom or top of the counter array 520, such that the delay amount of clocks reaching the precharge pulse generators 541 and 551 placed at the sides of the counter array 520 are set to the same value, which makes it possible to avoid timing skew between the precharge pulse signals being transmitted through the first and second precharge circuits 540 and 550.

In an embodiment of the disclosed technology, the data readout apparatus may include two or more precharge drivers. For example, where the counter array includes a plurality of counter groups each including a preset number of counters, two or more precharge drivers may be arranged at each counter group. When several hundreds to thousands of counters are included in the counter array, a precharge driver may be coupled in common to hundreds of counters, and the clock driver 530 may adjust the delay amounts of clocks reaching the precharge pulse generators coupled to the respective precharge drivers.

In an embodiment of the disclosed technology, the number of precharge pulse generators is different from the number of precharge drivers. For example, each precharge circuit includes one precharge pulse generator and four precharge drivers. As another example, each precharge circuit includes one precharge pulse generator and eight precharge drivers. In these scenarios, precharge pulses outputted from different precharge pulse generators may have different delay amounts depending on the distances of the respective precharge drivers from the precharge pulse generator. Although the positions of the respective precharge drivers are different from each other, the operation of the counter array can be stabilized through the precharge pulse to which different delay amounts are applied.

Figure 6:
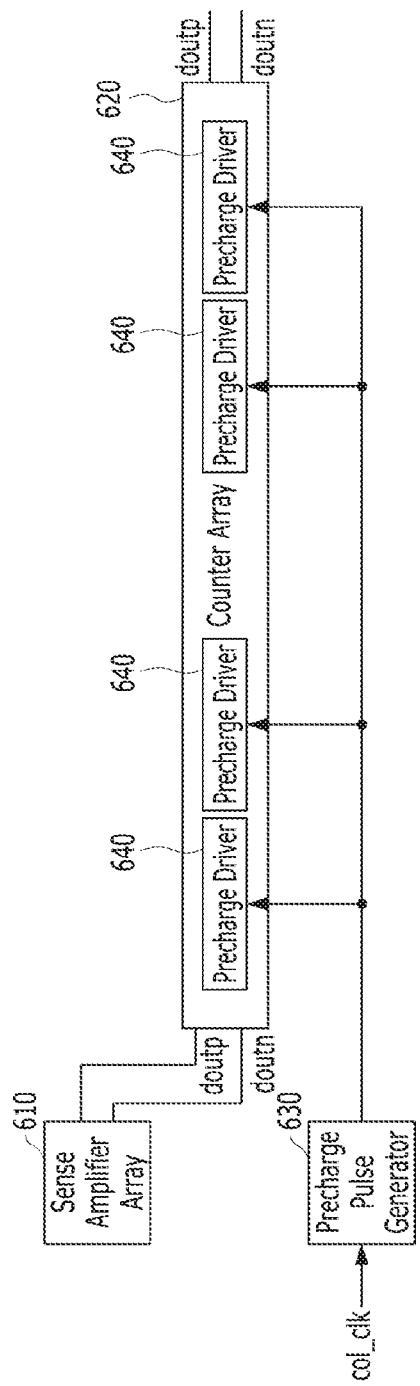
FIG. 6 is a configuration diagram of an example of a data readout apparatus implemented based on some embodiments of the disclosed technology.

FIG. 6 is a configuration diagram of an example of a data readout apparatus implemented based on some embodiments of the disclosed technology, illustrating a structure in which precharge drivers 640 are distributed over the area of a counter array 620 to reduce a parasitic RC load of the precharge drivers.

The data readout apparatus implemented based on another embodiment of the disclosed technology may include a counter array 620, a sense amplifier array 610, a precharge pulse generator 630, and one or more precharge drivers 640. The counter array 620 may perform a counting operation based on a column address col_addr. The sense amplifier array 610 may read data from the counter array 620. The precharge pulse generator 630 may receive a column clock col_clk from a digital timing generator (not illustrated) and generate a precharge pulse signal. The one or more precharge drivers 640 may be distributed over the area of the counter array 620 to receive the precharge pulse signal generated by the precharge pulse generator 630 and reset differential data lines.

In the data readout apparatus implemented based on another embodiment of the disclosed technology, the precharge drivers 640 may be distributed over the area of the counter array 620 to perform a precharge function. Thus, since the distances between the precharge drivers 640 and the counter array are reduced, the delay amount may be determined based only on the precharge pulse signal applied to the counter array 620. In this example configuration, the precharge pulse generator 630 may be placed in a peripheral device of the counter array 620.

Figure 7:
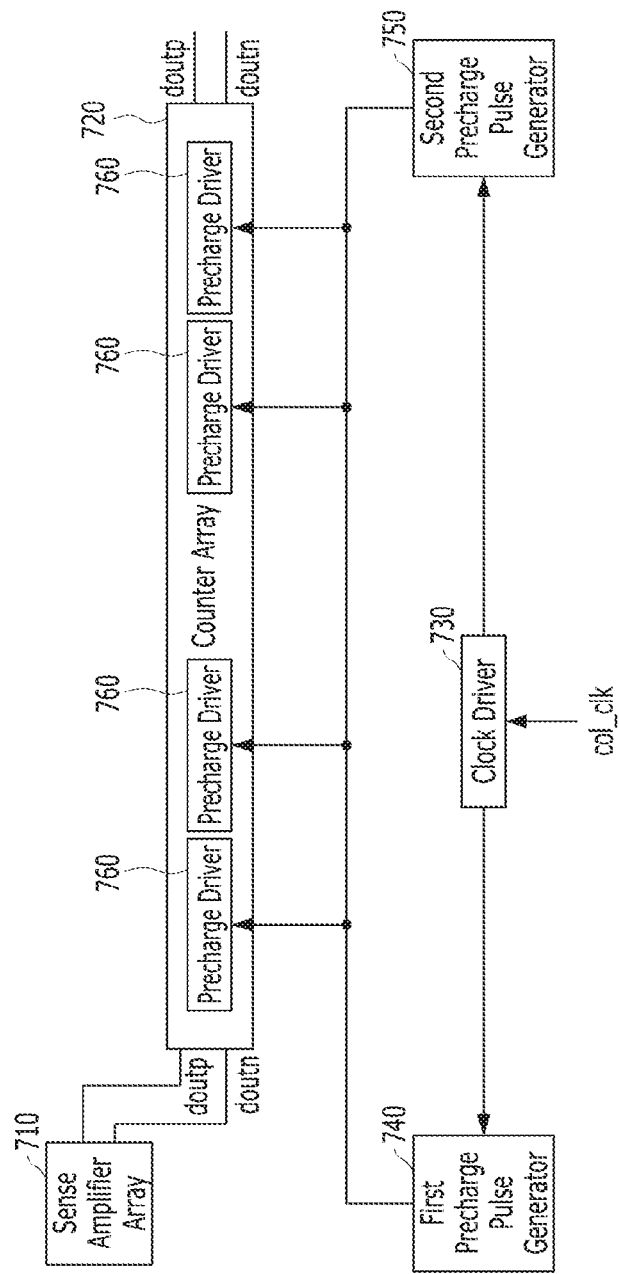
FIG. 7 is a configuration diagram of an example of a data readout apparatus implemented based on some embodiments of the disclosed technology.

FIG. 7 is a configuration diagram of an example of a data readout apparatus implemented based on some embodiments of the disclosed technology, illustrating a structure in which precharge pulse generators 740 and 750 are placed at sides of a counter array 520 in order to secure a bandwidth of a precharge pulse signal.

The data readout apparatus implemented based on another embodiment of the disclosed technology may include a counter array 720, a sense amplifier array 710, a clock driver 730, a first precharge pulse generator 740, a second precharge pulse generator 750, and one or more precharge drivers 760. The counter array 720 may perform a counting operation based on a column address col_addr. The sense amplifier array 710 may read data from the counter array 720. The clock driver 730 may be placed at the center of the counter array 720 to distribute column clock pulses col_clk applied from a digital timing generator (not illustrated). The first precharge pulse generator 740 may be placed at one side of the counter array 720 to receive a column clock col_clk from the clock driver 730 and generate a precharge pulse signal. The second precharge pulse generator 750 may be placed at the other side of the counter array 720 to receive the column clock col_clk from the clock driver 730 and generate a precharge pulse signal. The one or more precharge drivers 760 may be distributed over the area of the counter array 620 to receive the precharge pulse signals generated by the first and second precharge pulse generators 740 and 750 and reset differential data lines.

As such, in order to secure the bandwidth of a signal when the precharge pulse signal is short, the first precharge pulse generator 740 may be placed in one peripheral region of the counter array 720, and the second precharge pulse generator 750 may be placed in the other peripheral region of the counter array 720. In this way, the data readout apparatus may be used for a high-speed precharge circuit by reducing the parasitic RC load of the precharge driver by half. The clock driver 730 may be placed at the center of the bottom or top of the counter array 720.

Figure 8:
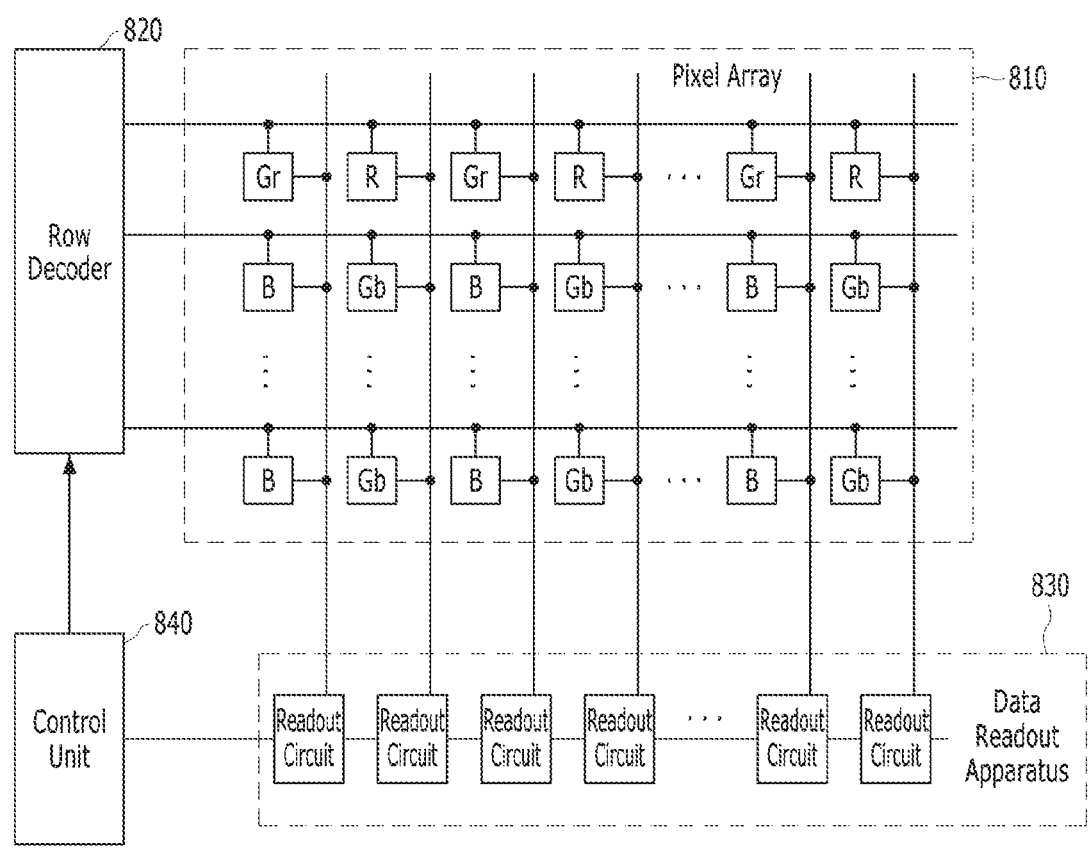
FIG. 8 is a configuration diagram illustrating an example of an image sensor implemented based on some embodiments of the disclosed technology.

FIG. 8 is a configuration diagram illustrating an example of an image sensor implemented based on some embodiments of the disclosed technology.

As illustrated in FIG. 8, the image sensor such as a CIS implemented based on some embodiments of the disclosed technology may include a pixel array 810, a row decoder 820, a data readout apparatus 830 and a control circuit 840. The pixel array 810 may output pixel signals corresponding to incident light. The row decoder 820 may select a pixel within the pixel array 810 at each row line and control an operation of the selected pixel, under control of a control circuit 840. The data readout apparatus 830 may read out the pixel signals outputted from the pixel array 810 and output the read data, under control of the control circuit 840. The control circuit 840 may control the operations of the row decoder 820 and the data readout apparatus 830. The data readout apparatus 830 may be used as any one of the data readout apparatuses of FIGS. 5 to 7 implemented based on some embodiments of the disclosed technology.

In some embodiments of the disclosed technology, the data readout apparatus may use the dual precharge scheme, instead of a single precharge scheme, to read out data of the counter, increasing the voltage swing margin of the sense amplifier.

Furthermore, the data readout apparatus can reduce the RC load of the precharge driver by half.

Furthermore, since data can be read out at high speed, the number of channels may be reduced. Therefore, the numbers of sense amplifiers and data lines can be decreased, which makes it possible to reduce the power consumption and the area needed for the image sensor.

Although various embodiments have been described for illustrative purposes, it will be apparent to those skilled in the art that various changes and modifications may be made without departing from the spirit and scope of the invention as defined in the following claims.

What is claimed is:

1. A data readout apparatus comprising:
   a counter array including an address decoder and a counter circuit, the address decoder being configured to receive an address, the counter circuit being coupled to the address decoder and perform, based on the address, a counting operation to convert an analog signal into data;
   a sense amplifier array coupled to the counter array and structured to read out the data from the counter array;
   a clock driver arranged adjacent to the center of the counter array to distribute clock pulses;
   a first precharge circuit arranged adjacent to one side of the counter array and structured to receive the clock pulses from the clock driver and perform a precharge operation; and
   a second precharge circuit arranged adjacent to the other side of the counter array and structured to receive the clock pulses from the clock driver and perform the precharge operation.

2. The data readout apparatus of claim 1, wherein the first precharge circuit comprises:
   a first precharge pulse generator arranged in a peripheral region of the counter array adjacent to the one side of the counter array to receive the clock pulses from the clock driver and generate a precharge pulse signal; and
   a first precharge driver coupled to the first precharge pulse generator to receive the precharge pulse signal generated by the first precharge pulse generator to reset differential data lines coupled to the counter array to output the data from the counter array.

3. The data readout apparatus of claim 2, wherein the second precharge circuit comprises:
   a second precharge pulse generator arranged in an opposite peripheral region of the counter array adjacent to the other side of the counter array to receive the clock pulses from the clock driver and generate a precharge pulse signal; and
   a second precharge driver coupled to the second precharge pulse generator to receive the precharge pulse signal generated by the second precharge pulse generator to reset differential data lines coupled to the counter array to output the data from the counter array.

4. The data readout apparatus of claim 1, wherein the first precharge circuit is arranged in a peripheral region at one side of the counter array, and the second precharge circuit is arranged in another peripheral region at the other side of the counter array.

5. The data readout apparatus of claim 1, wherein the clock driver is arranged adjacent to the center of the bottom or top of the counter array.

6. A data readout apparatus comprising:
a counter array including an address decoder and a counter circuit, the address decoder being configured to receive an address, the counter circuit being coupled to the address decoder and perform, based on the address, a counting operation to convert an analog signal into data;
a sense amplifier array coupled to the counter array to read out the data from the counter array;
a precharge pulse generator to receive clock pulses and generate a precharge pulse signal; and
a plurality of precharge drivers distributed over an area of the counter array and coupled in common to the precharge pulse generator, each precharge driver receiving the precharge pulse signal generated by the precharge pulse generator to reset differential data lines.

7. The data readout apparatus of claim 6, wherein the precharge pulse generator is arranged in a peripheral region of the counter array, and the counter array includes a plurality of counter groups each including a preset number of counters, and the precharge drivers are arranged at each counter group.

8. A data readout apparatus comprising:
a counter array including an address decoder and a counter circuit, the address decoder being configured to receive an address, the counter circuit being coupled to the address decoder and perform, based on the address, a counting operation to convert an analog signal into data;
a sense amplifier array coupled to the counter array to read out the data from the counter array;
a clock driver arranged adjacent to the center of the counter array to distribute clock pulses;
a first precharge pulse generator arranged adjacent to one side of the counter array and structured to receive the clock pulses from the clock driver and generate a precharge pulse signal;
a second precharge pulse generator arranged adjacent to the other side of the counter array and structured to receive the clock pulses from the clock driver and generate the precharge pulse signal; and
a plurality of precharge drivers distributed over an area of the counter array and coupled in common to the first and second precharge pulse generators receiving the precharge pulse signals generated by the first and second precharge pulse generators to reset differential data lines.

9. The data readout apparatus of claim 8, wherein the first precharge pulse generator is arranged in a peripheral region at one side of the counter array, and the second precharge pulse generator is arranged in another peripheral region at the other side of the counter array.

10. The data readout apparatus of claim 8, wherein the clock driver is arranged adjacent to the center of the bottom or top of the counter array.

11. An image sensor comprising:
a pixel array including imaging pixels for sensing incident light to output pixel signals corresponding to the incident light;
a row decoder to select and control the imaging pixels within the pixel array at each row line;
a data readout apparatus to read out the pixel signals outputted from the pixel array and output the read data; and
a control circuit to control the operations of the row decoder and the data readout apparatus,
wherein the data readout apparatus comprises:
a counter array including an address decoder and a counter circuit, the address decoder being configured to receive a column address, the counter circuit being coupled to the address decoder and perform, based on the column address, a counting operation to convert the pixel signals into data;
a sense amplifier array coupled to the counter array and structured to read out the data from the counter array;
a clock driver arranged adjacent to the center of the counter array and structured to distribute a column clock;
a first precharge circuit arranged at one side of the counter array and structured to receive the column clock from the clock driver and perform a precharge operation; and
a second precharge circuit arranged at the other side of the counter array and structured to receive the column clock from the clock driver and perform the precharge operation.

12. The image sensor of claim 11, wherein the first precharge circuit comprises:
a first precharge pulse generator arranged in a peripheral region of the counter array to receive the column clock from the clock driver and generate a precharge pulse signal; and
a first precharge driver coupled to the first precharge pulse generator to receive the precharge pulse signal generated by the first precharge pulse generator to reset differential data lines coupled to the counter array to output the data from the counter array.

13. The image sensor of claim 11, wherein the second precharge circuit comprises:
a second precharge pulse generator arranged in another peripheral region of the counter array to receive the column clock from the clock driver and generate a precharge pulse signal; and
a second precharge driver coupled to the second precharge pulse generator to receive the precharge pulse signal generated by the second precharge pulse generator to reset differential data lines coupled to the counter array to output the data from the counter array.

14. The image sensor of claim 11, wherein the first precharge circuit is placed in a left peripheral device of the counter array, and the second precharge circuit is placed in a right peripheral device of the counter array.

15. The image sensor of claim 11, wherein the clock driver is arranged adjacent to the center of the bottom or top of the counter array.

16. An image sensor comprising:
a pixel array including imaging pixels for sensing incident light to output pixel signals corresponding to the incident light;
a row decoder to select and control the imaging pixels within the pixel array at each row line;
a data readout apparatus to read out the pixel signals outputted from the pixel array and output the read data; and a control circuit to control the operations of the row decoder and the data readout apparatus,
wherein the data readout apparatus comprises:
a counter array including an address decoder and a counter circuit, the address decoder being configured to receive a column address, the counter circuit being coupled to the address decoder and perform, based on the column address, a counting operation to convert the pixel signals into data;
a sense amplifier array coupled to the counter array and structured to read out the data from the counter array;
a precharge pulse generator structured to receive a column clock and generate a precharge pulse signal; and
a plurality of precharge drivers distributed over an area of the counter array and coupled in common to the precharge pulse generator, each precharge driver receiving the precharge pulse signal generated by the precharge pulse generator to reset differential data lines.

17. The image sensor of claim 16, wherein the precharge pulse generator is arranged in a peripheral region of the counter array, and the counter array includes a plurality of counter groups each including a preset number of counters, and the precharge drivers are arranged at each counter group.

18. An image sensor comprising:
a pixel array including imaging pixels for sensing incident light to output pixel signals corresponding to the incident light;
a row decoder to select and control the imaging pixels within the pixel array at each row line;
a data readout apparatus to read out the pixel signals outputted from the pixel array and output the read data; and
a control circuit to control the operations of the row decoder and the data readout apparatus,
wherein the data readout apparatus comprises:
a counter array including an address decoder and a counter circuit, the address decoder being configured to receive a column address, the counter circuit being coupled to the address decoder and perform, based on the column address, a counting operation to convert the pixel signals into data;
a sense amplifier array coupled to the counter array to read out the data from the counter array;
a clock driver arranged adjacent to the center of the counter array to distribute a column clock;
a first precharge pulse generator arranged at one side of the counter array and structured to receive the column clock from the clock driver and generate a precharge pulse signal;
a second precharge pulse generator arranged at the other side of the counter array and structured to receive the column clock from the clock driver and generate the precharge pulse signal; and
a plurality of precharge drivers distributed over an area of the counter array and coupled in common to the first and second precharge pulse generators receiving the precharge pulse signals generated by the first and second precharge pulse generators to reset differential data lines.

19. The image sensor of claim 18, wherein the first precharge pulse generator is arranged in a peripheral region at one side of the counter array, and the second precharge pulse generator is arranged in another peripheral region at the other side of the counter array.

20. The image sensor of claim 18, wherein the clock driver is arranged adjacent to the center of the bottom or top of the counter array.

* * * * *